(12) United States Patent
Onga et al.

(10) Patent No.: US 12,283,793 B2
(45) Date of Patent: Apr. 22, 2025

(54) SEMICONDUCTOR OPTICAL DEVICE

(71) Applicant: Lumentum Japan, Inc., Sagamihara (JP)

(72) Inventors: Masaru Onga, Kanagawa (JP); Takayuki Nakajima, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 522 days.

(21) Appl. No.: 17/657,030

(22) Filed: Mar. 29, 2022

(65) Prior Publication Data

US 2023/0187902 A1    Jun. 15, 2023

(30) Foreign Application Priority Data

Dec. 10, 2021  (JP) .................................. 2021-200995
Jan. 31, 2022  (JP) .................................. 2022-013154

(51) Int. Cl.
*H01S 5/042*  (2006.01)
*H01S 5/026*  (2006.01)
*H01S 5/12*   (2021.01)
*H01S 5/22*   (2006.01)

(52) U.S. Cl.
CPC .......... *H01S 5/04256* (2019.08); *H01S 5/026* (2013.01); *H01S 5/04252* (2019.08); *H01S 5/04254* (2019.08); *H01S 5/12* (2013.01); *H01S 5/22* (2013.01)

(58) Field of Classification Search
CPC .. H01S 5/04256; H01S 5/026; H01S 5/04252; H01S 5/04254; H01S 5/12; H01S 5/22; H01S 5/2231; H01S 5/16
See application file for complete search history.

(56) References Cited

U.S. PATENT DOCUMENTS

| | | | |
|---|---|---|---|
| 7,187,701 B2 * | 3/2007 | Mihashi | H01S 5/04254 372/45.01 |
| 2003/0165169 A1 | 9/2003 | Nomoto et al. | |
| 2007/0131960 A1 * | 6/2007 | Ohmi | H01S 5/32341 257/103 |
| 2008/0247439 A1 * | 10/2008 | Uchida | H01S 5/04254 372/87 |

FOREIGN PATENT DOCUMENTS

JP      2003258370 A    9/2003

* cited by examiner

*Primary Examiner* — Yuanda Zhang
(74) *Attorney, Agent, or Firm* — Harrity & Harrity, LLP

(57) ABSTRACT

A multi-terraced structure includes three or more sections with different thicknesses and adjacent to each other in a direction in which an optical waveguide extends. An adjacent pair of the three or more sections includes one section smaller in thickness and closer to an end face of the semiconductor multilayers and another section larger in thickness and farther from the end face of the semiconductor multilayers. The three or more sections include: a first section with a smallest thickness, including the lowermost layer; a second section adjacent to the first section, including the lowermost layer and additionally a stress relief layer composed of a material equal to or lower than Au in Young's modulus; and a third section with a largest thickness, including all layers from the uppermost layer to the lowermost layer.

20 Claims, 17 Drawing Sheets

COMPARATIVE EXAMPLE 2

COMPARATIVE EXAMPLE 3

SEMICONDUCTOR OPTICAL DEVICE

CROSS-REFERENCE TO RELATED APPLICATIONS

The present application claims priority to Japanese patent application numbers 2021-200995 filed on Dec. 10, 2021 and 2022-013154 filed on Jan. 31, 2022, the contents of which are hereby incorporated by reference into this application.

TECHNICAL FIELD

The present disclosure relates generally to a semiconductor optical device.

BACKGROUND

A multi-layered structure of several metals can be applied to an electrode of a semiconductor optical device. For example, a three-layer electrode structure can include a Ti layer, a Pt layer, and a Au layer (in order of proximity from semiconductor multilayers). A lowermost layer is intended to form an ohmic contact between the semiconductor multilayers and the electrode, an uppermost layer is intended for providing electrical and thermal continuity from outside and mixing of solder material and the electrode, and a middle layer is intended to prevent the mixing of the solder material and the semiconductor multilayers.

In many cases, there are differences in thermal expansion coefficient between the electrode and the semiconductor multilayers, so a stress may occur in the semiconductor multilayers, deteriorating reliability. As an example countermeasure, an electrode with a two-level structure, where the uppermost layer (an Au layer) recedes, can reduce the stress in the semiconductor multilayers at a device edge. However, since the uppermost layer (Au layer) recedes, the stress further increases inside the device.

SUMMARY

Some implementations described herein disperse stress in semiconductor multilayers.

In some implementations, a semiconductor optical device includes: semiconductor multilayers configured to include an optical waveguide; and an electrode in contact with a top of the semiconductor multilayers, the electrode having a multi-layered structure and a multi-terraced structure. The multi-layered structure has an uppermost layer comprising Au. The multi-layered structure has a lowermost layer comprising a material with a higher adhesion to the semiconductor multilayers than Au. The multi-terraced structure includes three or more sections with different thicknesses. Each of the three or more sections overlaps with the optical waveguide. The three or more sections are adjacent to each other in a direction in which the optical waveguide extends. An adjacent pair of the three or more sections include one section smaller in thickness and closer to an end face of the semiconductor multilayers and another section larger in thickness and farther from the end face of the semiconductor multilayers. The three or more sections include: a first section with a smallest thickness, including the lowermost layer; a second section adjacent to the first section, including the lowermost layer and additionally a stress relief layer comprising a material equal to or lower than Au in Young's modulus; and a third section with a largest thickness, including all layers from the uppermost layer to the lowermost layer.

DETAILED DESCRIPTION

Figure 1:
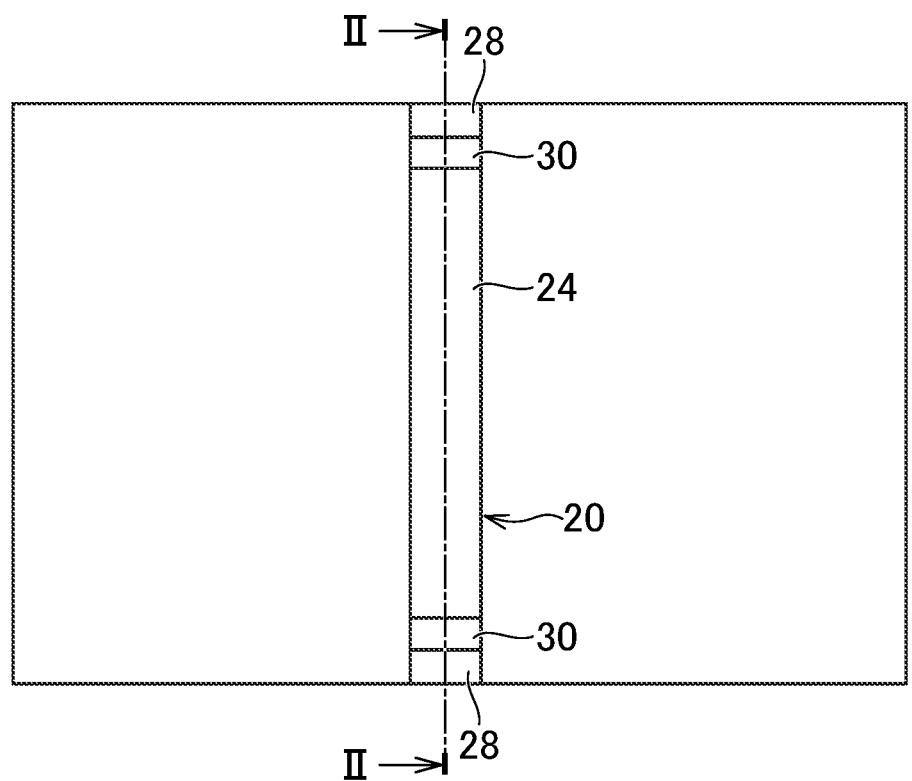
FIG. 1 is a plan view of a semiconductor optical device according to a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
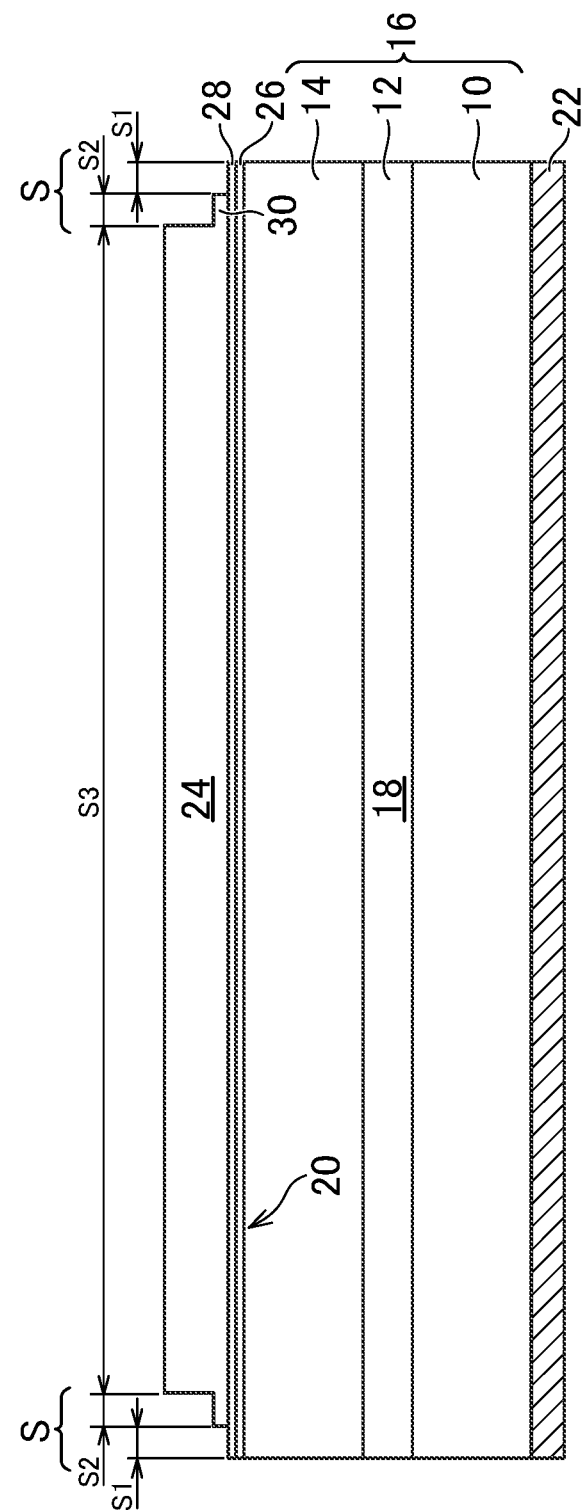
FIG. 2 is a II-II cross-sectional view of the semiconductor optical device in FIG. 1.

FIG. 1 is a plan view of a semiconductor optical device according to a first example implementation. FIG. 2 is a II-II cross-sectional view of the semiconductor optical device in FIG. 1. The semiconductor optical device may guide, emit, absorb, or amplify light, and may be a bulk waveguide, a laser, an optical modulator, or an optical amplifier, for example. FIG. 2 shows a cross-section, along an optical axis, of an edge emitting laser, where light may be output from at least one of both edges orthogonal to the optical axis.

The semiconductor optical device may have semiconductor multilayers 16 where a lower clad layer 10, an optical function layer 12, and an upper clad layer 14 may be laminated. The optical function layer 12 may be at least part of an optical waveguide 18. The optical functional layer 12 is, for example, a multiple quantum well layer and functions as an active layer (light emitting layer) in the laser. Alternatively, the optical functional layer 12 may be a bulk semiconductor layer. The lower clad layer 10 may be a semiconductor substrate or a semiconductor layer different from the semiconductor substrate. Other layers such as a contact layer and an optical confinement layer may be included in the semiconductor multilayers 16.

The semiconductor optical device may have an electrode 20 and a back electrode 22. The electrode 20 and the back electrode 22 may be formed by metal deposition. Metals to form the back electrode 22 may include, for example, AuGe or Ni. On a top of the semiconductor multilayers 16, an area other than the electrode 20 may be a semiconductor surface or may have an insulation film (e.g., silicon oxide) formed by a plasma chemical vapor deposition (CVD) method or a thermal CVD method. The electrode 20 may be in contact with the top of the semiconductor multilayers 16.

The electrode 20 may have a multi-layered structure. The multi-layered structure may have an uppermost layer 24 thicker (e.g., 600 nm) than other layers for wire bonding and a physical contact with a mounting surface of a submount. The uppermost layer 24 may comprise Au, which may have a higher thermal expansion coefficient than semiconductors such as InP, making it likely to be a source of stress in the semiconductor multilayers 16.

The multi-layered structure may have a lowermost layer 26 comprising a material (e.g., Ti, Mo) with a higher adhesion to the semiconductor multilayers 16 than Au, enabling an ohmic contact. The lowermost layer 26 may have a thickness of 100 nm, for example.

The multi-layered structure may include a barrier layer 28. The barrier layer 28 may comprise a material configured to prevent metal diffusion between the uppermost layer 24 and the lowermost layer 26 and entirely over the electrode 20. The material configured to prevent the metal diffusion may be, for example, Pt, W, Cr, Pd, or Ta. The barrier layer 28 may be in contact with the lowermost layer 26. The barrier layer 28 may have a thickness of 100 nm, for example.

The electrode 20 may have a multi-terraced structure. The multi-terraced structure may include three or more sections S. The three or more sections S may overlap with the optical waveguide 18, may be adjacent to each other in a direction in which the optical waveguide 18 extends, and may be different in thickness. One adjacent pair of the three or more sections S may be closer to an end face (device edge) of the semiconductor multilayers 16 and may be smaller in thickness. Another adjacent pair of the three or more sections S may be farther from the end face of the semiconductor multilayers 16 and may be larger in thickness.

Figure 3:
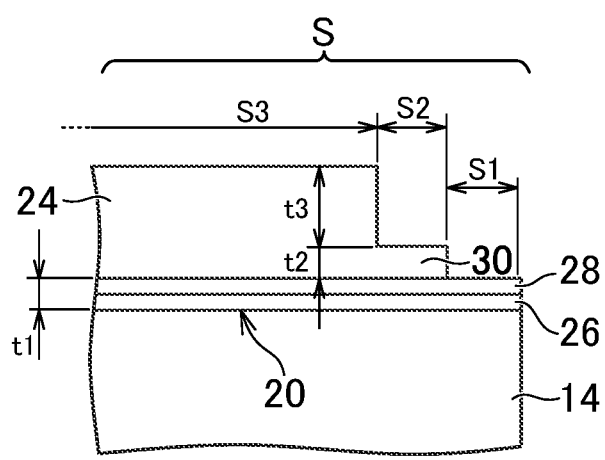
FIG. 3 is an enlarged view of a multi-terraced structure of an electrode.

FIG. 3 is an enlarged view of the multi-terraced structure of the electrode 20. The three or more sections S include a first section S1. The first section S1 may include the lowermost layer 26. Here, the first section S1 may include the lowermost layer 26 and the barrier layer 28. A layer making up the first section S1 may have an end face aligned with a side of the semiconductor multilayers 16 (device edge).

The first section S1 has a first thickness t1. The first thickness t1 may be the smallest among thicknesses of the three or more sections S. To reduce an impact of stress caused by the first section S1, the first thickness t1 may be smaller than the thickness of the uppermost layer 24. The first thickness t1 may be equal to or less than half of the thickness of the uppermost layer 24.

The three or more sections S include a second section S2. The second section S2 may be adjacent to the first section S1. The second section S2 may have a second thickness t2 that is greater than that of the first section S1.

The second section S2 may include the lowermost layer 26 (e.g., the lowermost layer 26 and the barrier layer 28) and additionally a stress relief layer 30 comprising a material equal to or lower than Au in Young's modulus. The stress relief layer 30 may be part of the uppermost layer 24 (the part that constitutes the bottom). The stress relief layer 30 may comprise Au and may have excellent heat dissipation. The stress relief layer 30 is, in Young's modulus, equal to or lower than Au that makes up the uppermost layer 24, therefore mitigating transmission of expansion or contraction of the uppermost layer 24, included in a third section S3 described later, to the semiconductor layer 16.

The stress relief layer 30 may be thinner than an overall thickness of the uppermost layer 24 to reduce an impact of stress caused by it. The stress relief layer 30 may have a thickness that is equal to or less than half of the uppermost layer 24. The second thickness t2 of the stress relief layer 30 may be 100 nm, for example.

There may be a distance of, for example, 10 μm between a tip of the second section S2 and a tip of the first section S1. The tip of the second section S2 may be located further inside than a side of the semiconductor multilayers 16. In other words, a distance from the tip of the second section S2 to the side of the multilayers 16 may be greater than a distance from the tip of the first section S1 to the side of the multilayers 16.

The three or more sections S include a third section S3. The third section S3 may include all layers from the uppermost layer 24 to the lowermost layer 26, having the greatest thickness among the three or more sections S. The third section S3 may have a third thickness t3 that is greater than that of the second section S2. At least one of the first thickness t1 and the second thickness t2 may be equal to or less than half of the third thickness t3.

The third section S3 may have a tip further inside, on the top of the semiconductor multilayers 16, than the tip of the second section S2. A distance from the tip of the third section S3 to the side of the semiconductor multilayers 16 may be greater than a distance from the tip of the second section S2 to the side of the multilayers 16. There may be a distance of, for example, 20 μm between the tip of the first section S1 and the tip of the third section S3.

In terms of stress, the tips of the first section S1, the second section S2, and the third section S3 may keep a large distance from each other. However, each layer that makes up the electrode 20 also plays a role as a heat radiation layer, making it undesirable to have a small area (volume). In particular, the first section S1, the second section S2, and the third section S3 may be high in heat generation near the tips. In terms of heat dissipation, the second section S2 and the third sections S3 should be close to the side of the semiconductor multilayers 16. For example, the distance between the tip of the first section S1 and the tip of the second section S2 may be 5 μm, and the distance between the tip of the first section S1 and the tip of the third section S3 may be 10 μm.

It depends on a viewpoint of stress and heat radiation how far the tip of the second section S2 and the tip of the third section S3 may be from the tip of the first section S1. As a minimum distance, from a viewpoint of manufacture irregularity, the distance between the tip of the first section S1 and the tip of the second section S2 should be 2 μm or more, and the distance between the tip of the first section S1 and the tip of the third section S3 should be 4 μm or more.

Figure 4:
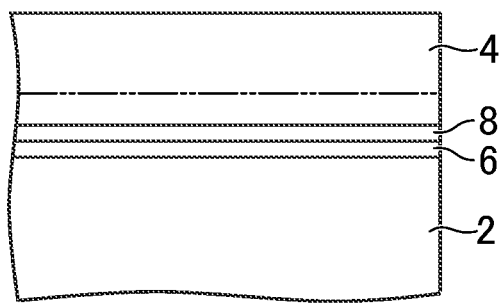
FIG. 4 is a cross-sectional view of an electrode according to Comparative Example 1.

FIG. 4 is a cross-sectional view of an electrode according to Comparative Example 1. In Comparative Example 1, the tips of the uppermost layer 4, the lowermost layer 6, and the barrier layer 8 are aligned with the side of the semiconductor multilayers 2. This concentrates stress on the side of the semiconductor multilayers 2.

Figure 5:
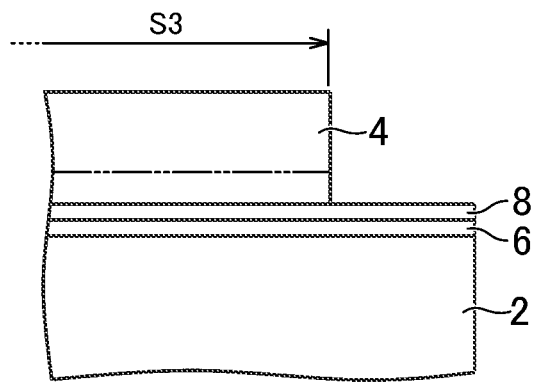
FIG. 5 is a cross-sectional view of an electrode according to Comparative Example 2.

FIG. 5 is a cross-sectional view of an electrode according to Comparative Example 2. In Comparative Example 2, the entire uppermost layer 4 is within the third section S3. In other words, the uppermost layer 4 is away from the side of the semiconductor multilayers 2. This relieves stress on the side of the semiconductor multilayers 2. However, just below the tip of the uppermost layer 4, the stress in the semiconductor multilayers 2 is larger than in Comparative Example 1.

Figure 6:
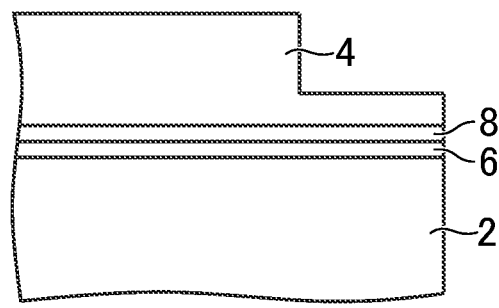
FIG. 6 is a cross-sectional view of an electrode according to Comparative Example 3.

FIG. 6 is a cross-sectional view of an electrode according to Comparative Example 3. In Comparative Example 3, the uppermost layer 4 has a two-stepped end portion with a thin tip aligned with the side of the semiconductor multilayers 2, so the stress on the side of the semiconductor multilayers 2 is smaller than in Comparative Example 1. However, since part of the uppermost layer 4 is aligned with the side of the multilayers 2, the stress on the side of the multilayers 2 is larger than in Comparative Example 2.

In this example implementation, the electrode 20 may have a multi-terraced structure, so the stress generated in the semiconductor multilayers 16 is dispersed. For example, the tips of the second section S2 and the third sections S3 may be not aligned with the side of the semiconductor multilayers 16 (device end face). In particular, the uppermost layer 24, which may comprise Au and may be a cause of generating a strong stress, may be not aligned with the side. Therefore, the stress generated on the side can be relieved.

The stress relief layer 30 may be a metal whose Young's modulus may be equal to or less than that of Au, thereby alleviating transmission of expansion or contraction of the uppermost layer 24 in the third section S3 to the semiconductor multilayers 16, whereby the impact of stress on the semiconductor multilayers 16 can be reduced. In particular, since the tip of the second section S2 may be not aligned with the tip of the third section S3, the stress applied just under the tip of the third section S3 may be reduced, thereby reducing the stress applied inside the device. Furthermore, the uppermost layer 24, which may be the Au layer, may be not aligned with the side, thereby leading to excellent cleavability because of no need to cut the Au layer when the semiconductor multilayers 16 may be cut.

The multi-terraced structure of the electrode 20 may be formed by following procedures from a viewpoint of mass productivity. First, after forming the semiconductor multilayers 16, metal multilayers from the lowermost layer 26 to the uppermost layer 24 may be deposited entirely on the top of the semiconductor multilayers 16. Then, the metal multilayers may be etched to leave an overall planar shape of the electrode 20.

Next, an etching mask to cover the planar shape of the second section S2 and the third section S3 may be formed by applying a lithography method. Then, a selective etching may be performed, in which etching proceeds on the uppermost layer 24 but the etching proceeds slowly on the layers just below it. As a result, the uppermost layer 24 may be removed in the first section S1 to form the tip of the second section S2. In other words, a step may be formed between the first section S1 and the second section S2.

Next, the uppermost layer 24 may be etched again in the second section S2 through an etching mask that covers an area to be the third section S3 but does not cover the second section S2. However, the uppermost layer 24 may not be entirely removed but part of it may be left by controlling an etching rate and an etching time. This forms the tip of the third section S3, forming a step between the second section S2 and the third section S3. Together with the previously formed step, a multi-terraced structure may be formed.

Figure 7:
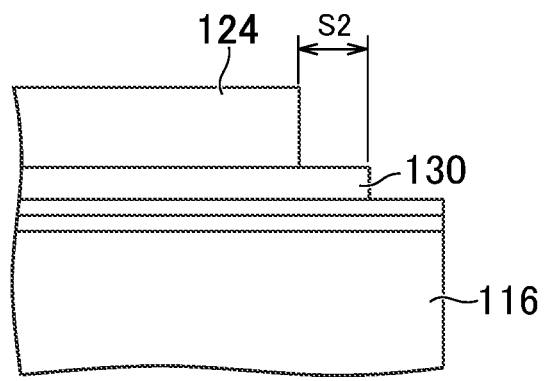
FIG. 7 is a cross-sectional view of an electrode according to a Modification 1.

FIG. 7 is a cross-sectional view of an electrode according to a Modification 1. In Modification 1, the stress relief layer 130 in the second section S2 may be a layer different from the uppermost layer 124. The stress relief layer 130 may comprise a metal (e.g., In) that may be smaller in Young's modulus than Au, which constitutes the uppermost layer 124. The stress relief layer 130 may be the metal whose Young's modulus may be less than that of Au, thereby alleviating transmission of expansion or contraction of the uppermost layer 124 to the semiconductor multilayers 116, whereby the stress in the semiconductor multilayers 116 may be reduced.

Figure 8:
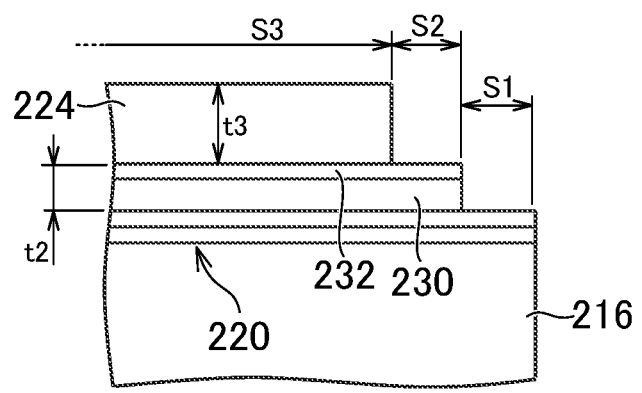
FIG. 8 is a cross-sectional view of an electrode according to a Modification 2.

FIG. 8 is a cross-sectional view of an electrode according to a Modification 2. In Modification 2, the stress relief layer 230 in the second section S2 may be a layer (non-contact layer) different from the uppermost layer 224, but may comprise Au as the uppermost layer 224. The stress relief layer 230 may have a thickness of 100 nm. The stress relief layer 230 may reduce an impact, on the semiconductor multilayers 216, imposed by the third section S3 at the tip due to expansion or contraction of it.

The multi-layered structure of the electrode 220 may include a partial barrier layer 232, comprising a material configured to prevent metal diffusion, at least in the third section S3 (e.g., second section S2 and third section S3) except for the first section S1. The partial barrier layer 232 may have a thickness of 100 nm. The partial barrier layer 232 may be also included in the second section S2. The material to prevent the metal diffusion may be Pt, W, Cr, Pd, or Ta.

The layer that makes up a top surface of the second section S2 may not be limited to the partial barrier layer 232 but may be any other layer. For example, it may be a Ti layer. The partial barrier layer 232 and the Ti layer may be laminated between the uppermost layer 224 and the stress relief layer 230. However, the second section S2 may have the second thickness t2 equal to or less than half of the third thickness t3 to avoid an increased stress in the semiconductor multilayers 216 just below the tip of it.

In Modification 2, the process of forming a stepped shape may be efficiently achieved. First, the metal multilayers may be deposited on the entire top of the semiconductor multilayers 216. Then, unnecessary portions may be removed from the metal multilayers in the first section S1. In the second section S2 and the third section S3, all layers of the metal multilayers may be left.

Next, an area to be the third section S3 may be masked and etching may be performed with a solution that etches only Au. If the layer that makes up the top surface of the second section S2 comprises the partial barrier layer 232 (e.g., Pt) or Ti, the etching will not proceed. This enables selective etching without time control and enables removal of unnecessary portions in the second section S2, leading to large-scale and efficient manufacturing.

Figure 9:
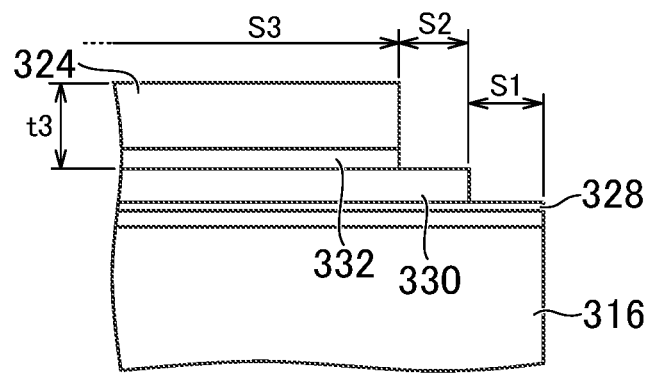
FIG. 9 is a cross-sectional view of an electrode according to Modification 3.

FIG. 9 is a cross-sectional view of an electrode according to Modification 3. In Modification 3, the barrier layer 328 may be thin (e.g., 50 nm). This reduces an impact, on the side of the semiconductor multilayers 316, imposed by the tip of the first section S1. However, controlling a thickness of a thin film can result in a too small thickness or lack of enough density in some areas. As a result, Au may diffuse to the semiconductor multilayers 316, deteriorating reliability.

So, in Modification 3, the multi-layered structure may include the partial barrier layer 332 at least in the third section S3 (e.g., third section S3 only) except for the first section S1. The partial barrier layer 332 may comprise a material that prevents metal diffusion. The material that prevents the metal diffusion may be Pt, W, Cr, Pd, or Ta. The partial barrier layer 332 may have a thickness of 100 nm. The partial barrier layer 332 can enhance an effect of preventing the diffusion of Au of the uppermost layer 324 on it from diffusing to a layer below it. As a result, the diffusion of Au constituting the uppermost layer 324 may be sufficiently suppressed.

In the third section S3, the uppermost layer 324 may have a thickness of 600 nm, where the third thickness t3 increases due to addition of the partial barrier layer 332. This increases the impact imposed by the expansion or contraction of the third section S3. However, the stress relief layer 330 in the second section S2 disperses the stress, reducing the impact to the semiconductor multilayers 316. The stress relief layer 330 in the second section S2 may be a layer different from the uppermost layer 324.

Figure 10:
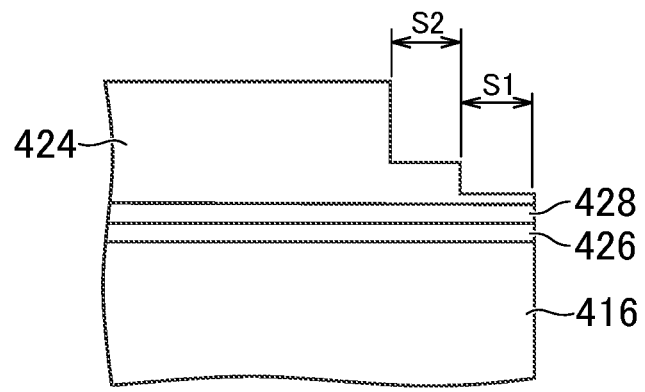
FIG. 10 is a cross-sectional view of an electrode according to a Modification 4.

FIG. 10 is a cross-sectional view of an electrode according to a Modification 4. In Modification 4, the first section S1 may include part of the uppermost layer 424. The part of the uppermost layer 424, included in the first section S1, improves heat dissipation on and near the side of the semiconductor multilayers 416, leading to higher characteristics. In other words, Modification 4 achieves high heat dissipation and reliability.

On the other hand, the part of the uppermost layer 424 included in the first section S1 may be a cause of the stress if it is thick, leading to low reliability. Therefore, the part of the uppermost layer 424 included in the first section S1 should be, in the thickness, equal to or less than half (e.g., 25 nm) of the part of the uppermost layer 424 included in the second section S2. Note that each of the lowermost layer 426 and the barrier layer 428 may have a thickness of 100 nm.

Figure 11:
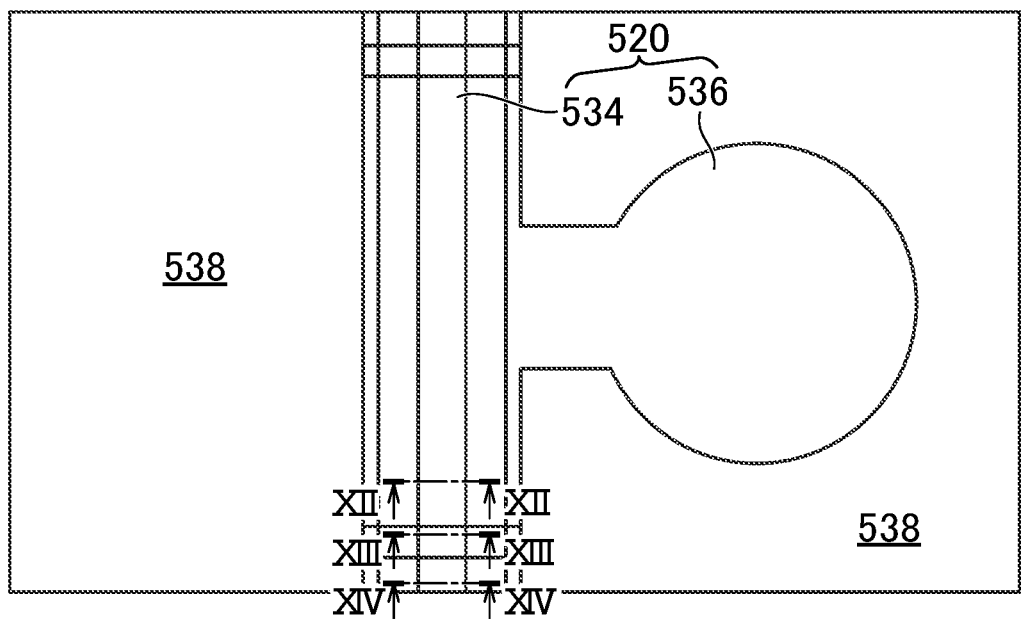
FIG. 11 is a plan view of a semiconductor optical device according to a second example implementation.
Figure 12:
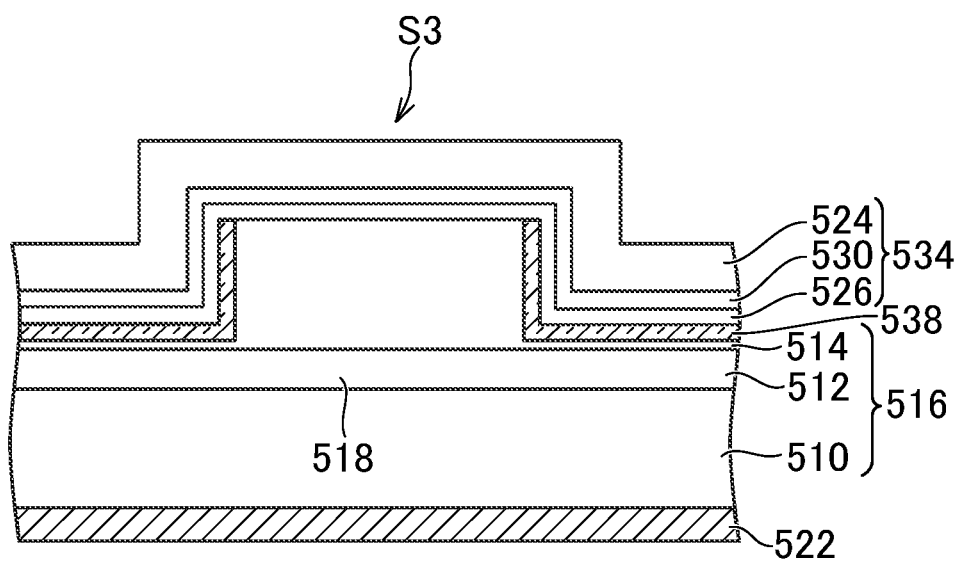
FIG. 12 is a XII-XII cross-sectional view of the semiconductor optical device in FIG. 11.
Figure 13:
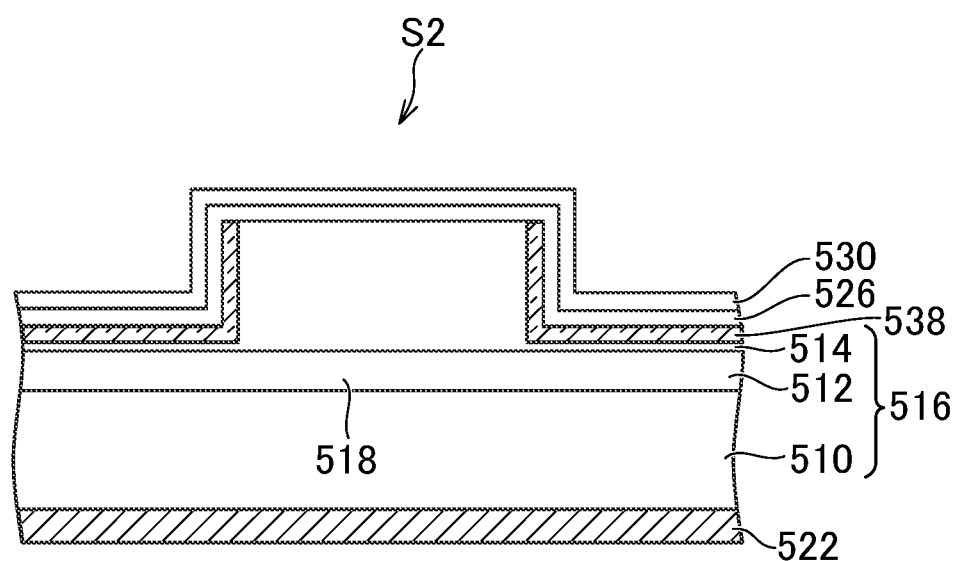
FIG. 13 is a XIII-XIII cross-sectional view of the semiconductor optical device in FIG. 11.
Figure 14:
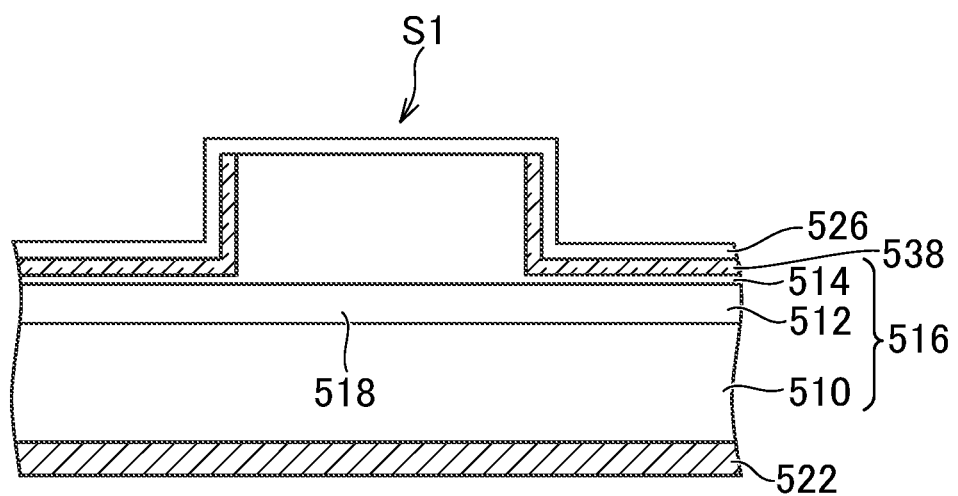
FIG. 14 is a XIV-XIV cross-sectional view of the semiconductor optical device in FIG. 11.

FIG. 11 is a plan view of a semiconductor optical device according to a second example implementation. FIG. 12 is a XII-XII cross-sectional view of the semiconductor optical device in FIG. 11. FIG. 13 is a XIII-XIII cross-sectional view of the semiconductor optical device in FIG. 11. FIG. 14 is a XIV-XIV cross-sectional view of the semiconductor optical device in FIG. 11.

The semiconductor optical device may be a distributed feedback semiconductor laser (DFB laser) with a ridge waveguide structure. The optical function layer 512, which constitutes at least part of the optical waveguide 518, may be a multiple quantum well layer, for example, and functions as an active layer (light emitting layer).

The semiconductor multilayers 516 include the lower clad layer 510, the optical function layer 512, and the upper clad layer 514. The lower clad layer 510 and the upper clad layer 514 may be InP, while the optical function layer 512 may be InGaAsP. The lower clad layer 510 may be a semiconductor substrate or a semiconductor layer different from the semiconductor substrate. Between the optical function layer 512 and the lower clad layer 510, there may be a diffraction grating layer (not shown) with a diffraction grating structure comprising InGaAsP. The diffraction grating layer may be disposed between the optical function layer 512 and the upper clad layer 514.

Between the optical function layer 512 and the diffraction grating layer and between the optical function layer 512 and the upper clad layer 514, there may be an optical confinement layer (not shown) comprising InGaAsP. The optical function layer 512 and the optical confinement layer may not be limited to InGaAsP but may also be InGaAlAs. The semiconductor multilayers 516 may include a contact layer.

The semiconductor multilayers 516 may include a mesa structure that serves as the optical waveguide 518. The optical waveguide 518 may have a ridge waveguide type mesa structure (hereinafter referred to as a ridge structure). The ridge structure may include part of the upper clad layer 514, may include part of the optical function layer 512, and may also include part of the lower clad layer 510.

The electrode 520 may include a main electrode 534 located along the optical waveguide 518 and above the optical waveguide 518 and may include a pad electrode 536 extending from the main electrode 534, although they may be continuously integrated. The pad electrode 536 may be configured to have a wire bonded thereto for transmitting electrical signals from outside. By applying a voltage between the electrode 520 and the back electrode 522, the semiconductor optical device may output a laser beam from the device edge.

In an area where the electrode 520 is not located, the semiconductor multilayers 516 may be covered with an insulation layer 538. The insulation layer 538 may be, for example, silicon oxide. Except for an electrical connection portion (just above the optical waveguide 518) between the main electrode 534 and the semiconductor multilayers 516, the insulation layer 538 may be also located below part of the electrode 520.

The main electrode 534 may have the multi-terraced structure on the top of the ridge structure. The main electrode 534 also may have the multi-terraced structure on the side of the ridge structure or on both sides of the ridge structure, to prevent stress concentration in the semiconductor multilayers 516 in these areas as well. The details of the multi-terraced structure described in the above example implementation may be applicable hereto.

The semiconductor optical device may be manufactured by the following method. Crystal growth proceeds on the semiconductor substrate by metal organic chemical vapor deposition (MOCVD) or molecular beam epitaxy (MBE), resulting in crystal growth of the lower clad layer 510, the optical function layer 512, and the upper clad layer 514. Then, an etching mask covering the optical waveguide 518 (mesa structure) may be formed, and etching (dry etching or wet etching) may be performed to form the ridge-type optical waveguide 518.

To protect a surface of the semiconductor multilayers 516, an insulation layer 538 (e.g., silicon oxide) may be formed over the entire surface by a plasma CVD method or a thermal CVD method. Then, the insulation layer 538 may be etched through an etching mask with an opening at an area (electrical connection area) just above the optical waveguide 518. The metal multilayers may then be formed by vapor deposition, starting from one layer closest to the semiconductor layer 516.

Next, etching may be performed through an etching resist covering only the area to be the third section S3, and then a surface shape of the third section S3 may be formed from the uppermost layer 524. However, instead of entirely removing the area other than the third section S3, the area may be thinned by etch back and left behind.

Next, etching may be performed through an etching resist that covers only areas to be the second section S2 and the third section S3, to form a surface shape (stress relief layer 530) in the second section S2 from the uppermost layer 524. However, instead of entirely removing the areas other than the second section S2 and the third section S3, the areas may be thinned by etch back and left behind.

Next, etching may be performed through an etching resist that covers only areas to be the first section S1, the second section S2, and the third section S3, to form a surface shape (layer 526 including the lowermost layer and the barrier layer) in the first section S1. However, the etching should not reach a layer (insulation layer 538) below the layer 526.

Figure 15:
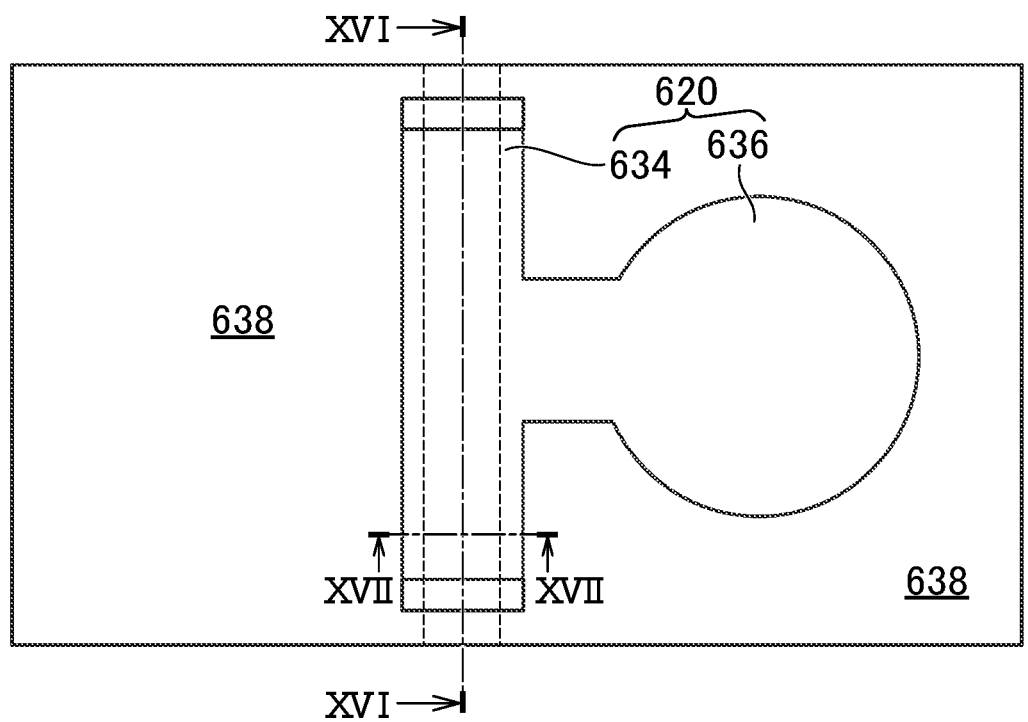
FIG. 15 is a plan view of a semiconductor optical device according to a third example implementation.
Figure 16:
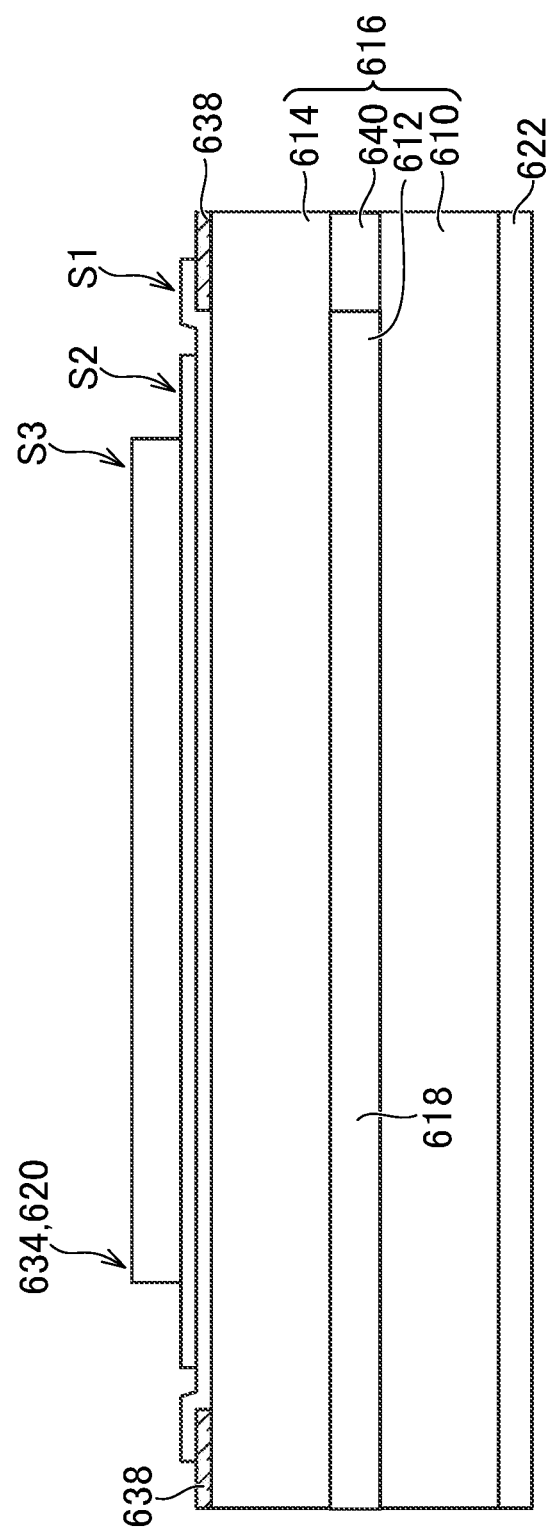
FIG. 16 is a XVI-XVI cross-sectional view of the semiconductor optical device in FIG. 15.
Figure 17:
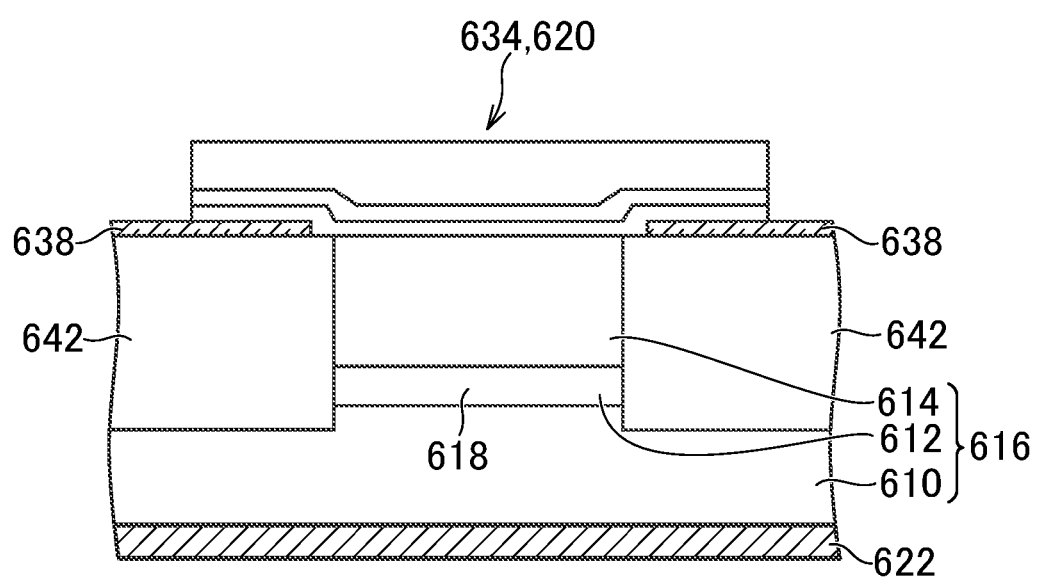
FIG. 17 is a XVII-XVII cross-sectional view of the semiconductor optical device in FIG. 15.

FIG. 15 is a plan view of a semiconductor optical device according to a third example implementation. FIG. 16 is a XVI-XVI cross-sectional view of the semiconductor optical device in FIG. 15. FIG. 17 is a XVII-XVII cross-sectional view of the semiconductor optical device in FIG. 15.

The semiconductor optical device may be an optical modulator (e.g., electro-absorption modulator) configured to convert continuous light input, from one end face, into modulated light. The optical functional layer 612, which constitutes at least part of the optical waveguide 618, may be a multiple quantum well layer, for example, and functions as an optical absorption layer.

The semiconductor multilayers 616 include a mesa structure as the optical waveguide 618. The optical waveguide 618 may have a mesa structure. In FIG. 15, the mesa structure may be shown as a dashed line. The mesa structure may include part of the lower clad layer 610, the optical function layer 612, and the upper clad layer 614. Each side of the mesa structure may be embedded with a buried layer 642 made of semiconductors. The lower clad layer 610 and the upper clad layer 614 may be InP, while the optical function layer 612 may be InGaAsP. An optical confinement layer (not shown) comprising InGaAsP may be disposed between the optical functional layer 612 and the lower clad layer 610 and between the optical functional layer 612 and the upper clad layer 614.

The optical waveguide 618 may include a non-absorbent material layer 640 (window structure). The non-absorbent material layer 640 achieves an effect of reducing reflection on a light-emitting end face and back toward the optical functional layer 612. The non-absorbent material layer 640 may have a larger band gap than the optical functional layer 612. The non-absorbent material layer 640 may be adjacent to the optical functional layer 612 in an optical waveguide direction. The non-absorbent material layer 640 constitutes part of the side (device edge) of the semiconductor multilayers 616.

The semiconductor optical device may have the electrode 620 and the back electrode 622. The electrode 620 may include the main electrode 634 located along the optical waveguide 618 and above the optical waveguide 618, and may include the pad electrode 636 extending from the main electrode 634, although they may be continuously integrated. The pad electrode 636 may be configured to have a wire bonded thereto for transmitting electrical signals from outside. By applying a voltage between the electrode 620 and the back electrode 622, the semiconductor optical device modulates light incident from the end face.

The main electrode 634 may have the multi-terraced structure on the top of the ridge structure. The details of the multi-terraced structure described in the above embodiments may be applicable hereto. Due to no need to input electricity to the non-absorbent material layer 640, the electrode 634 above the non-absorbent material layer 640 does not reach the edge (device end face) of the top of the semiconductor multilayers 616. On a side where the non-absorbent material layer 640 may be located, the tip of the first section S1 may be located further inside than the side of the semiconductor multilayers 616. The end face of the layer making up the first section S1 may be away from the side of the semiconductor multilayers 616. The electrode 620 may have a portion, just above the non-absorbent material layer 640, that may be insulated from the semiconductor multilayers 616 through the insulation layer 638. The configuration of the electrode 620 may be only one example, and may be the same as in another example implementation.

In a first implementation, a semiconductor optical device includes: semiconductor multilayers 16 configured to include an optical waveguide 18; and an electrode 20 in contact with a top of the semiconductor multilayers 16, the electrode 20 having a multi-layered structure and a multi-terraced structure, the multi-layered structure having an uppermost layer 24 comprising Au, the multi-layered structure having a lowermost layer 26 comprising a material with a higher adhesion to the semiconductor multilayers 16 than Au, the multi-terraced structure including three or more sections S with different thicknesses, each of the three or more sections S overlapping with the optical waveguide 18, the three or more sections S being adjacent to each other in a direction in which the optical waveguide 18 extends, an adjacent pair of the three or more sections S including one section smaller in thickness and closer to an end face of the semiconductor multilayers 16 and another section S larger in thickness and farther from the end face of the semiconductor multilayers 16, the three or more sections S including: a first section S1 with a smallest thickness, including the lowermost layer 26; a second section S2 adjacent to the first section S1, including the lowermost layer 26 and additionally a stress relief layer 30 comprising a material equal to or lower than Au in Young's modulus; and a third section S3 with a largest thickness, including all layers from the uppermost layer 24 to the lowermost layer 26.

In a second implementation, alone or in combination with the first implementation, the stress relief layer 30 in the second section S2 may be part of the uppermost layer 24.

In a third implementation, alone or in combination with one or more of the first and second implementations, the first section S1 may further include other part of the uppermost layer 424.

In a fourth implementation, alone or in combination with one or more of the first through third implementations, the other part of the uppermost layer 424 included in the first section S1 may be, in the thickness, equal to or less than half of the part of the uppermost layer 424 included in the second section S2.

In a fifth implementation, alone or in combination with one or more of the first through fourth implementations, the stress relief layer 130 in the second section S2 may be a layer different from the uppermost layer 124.

In a sixth implementation, alone or in combination with one or more of the first through fifth implementations, the first section S1 may have a first thickness t1, the second section S2 may have a second thickness t2 that is greater than the first thickness t1, the third section S3 has a third thickness t3 that is greater than the second thickness t2, and at least one of the first thickness t1 and the second thickness t2 may be equal to or less than half of the third thickness t3.

In a seventh implementation, alone or in combination with one or more of the first through sixth implementations, the multi-layered structure may include a barrier layer 28 between the uppermost layer 24 and the lowermost layer 26 and entirely over the three or more sections S, the barrier layer 28 comprising a material configured to prevent metal diffusion.

In an eighth implementation, alone or in combination with one or more of the first through seventh implementations, the barrier layer 28 may be a layer in contact with the lowermost layer 26.

In a ninth implementation, alone or in combination with one or more of the first through eighth implementations, the multi-layered structure may include a partial barrier layer 232 at least in the third section S3 except for the first section S1, the partial barrier layer 232 comprising a material configured to prevent metal diffusion.

In a tenth implementation, alone or in combination with one or more of the first through ninth implementations, the partial barrier layer 232 may be also included in the second section S2.

In an eleventh implementation, alone or in combination with one or more of the first through tenth implementations, the material configured to prevent the metal diffusion may be Pt, W, Cr, Pd, or Ta.

In an twelfth implementation, alone or in combination with one or more of the first through eleventh implementations, the lowermost layer 26 may comprise Ti or Mo.

In a thirteenth implementation, alone or in combination with one or more of the first through twelfth implementations, a layer making up a top surface of the second section S2 may comprise Pt or Ti.

In a fourteenth implementation, alone or in combination with one or more of the first through thirteenth implementations, a layer making up the first section S1 may have an end face aligned with a side of the semiconductor multilayers 16.

In a fifteenth implementation, alone or in combination with one or more of the first through fourteenth implementations, a layer making up the first section S1 may have an end face away from a side of the semiconductor multilayers 616.

In a sixteenth implementation, alone or in combination with one or more of the first through fifteenth implementations, the semiconductor multilayers 516 may include a mesa structure as the optical waveguide 518.

In a seventeenth implementation, alone or in combination with one or more of the first through sixteenth implementations, the semiconductor multilayers 16 may include an active layer or an optical absorption layer that constitutes at least part of the optical waveguide 18.

In an eighteenth implementation, alone or in combination with one or more of the first through seventeenth implementations, the optical waveguide 618 may include a non-absorbent material layer 640 with a wider band gap than the active layer or the optical absorption layer, the non-absorbent material layer 640 may be adjacent to the active layer or the optical absorption layer in an optical waveguide direction, and the electrode 620 may have a portion, just above the non-absorbent material layer 640, which may be insulated from the semiconductor multilayers 616 with an insulation layer 638.

In a nineteenth implementation, alone or in combination with one or more of the first through eighteenth implementations, the electrode 520 may have the multi-terraced structure on a top of the mesa structure.

In a twentieth implementation, alone or in combination with one or more of the first through nineteenth implementations, the electrode 520 may have the multi-terraced structure on a side of the mesa structure.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor optical device comprising:
semiconductor multilayers configured to include an optical waveguide; and
an electrode in contact with a top of the semiconductor multilayers, the electrode having a multi-layered structure and a multi-terraced structure,
the multi-layered structure having an uppermost layer comprising Au,
the multi-layered structure having a lowermost layer comprising a material with a higher adhesion to the semiconductor multilayers than Au,
the multi-terraced structure including three or more sections with different thicknesses, each of the three or more sections overlapping with the optical waveguide, the three or more sections being adjacent to each other in a direction in which the optical waveguide extends,
an adjacent pair of the three or more sections including one section smaller in thickness and closer to an end face of the semiconductor multilayers and another section larger in thickness and farther from the end face of the semiconductor multilayers, the three or more sections including:
- a first section with a smallest thickness, including the lowermost layer;
- a second section adjacent to the first section, including the lowermost layer and additionally a stress relief layer comprising a material equal to or lower than Au in Young's modulus; and
- a third section with a largest thickness, including all layers from the uppermost layer to the lowermost layer.

2. The semiconductor optical device according to claim 1, wherein the stress relief layer in the second section is part of the uppermost layer.

3. The semiconductor optical device according to claim 2, wherein the first section further includes another part of the uppermost layer.

4. The semiconductor optical device according to claim 3, wherein the other part of the uppermost layer included in the first section is, in the thickness, equal to or less than half of the part of the uppermost layer included in the second section.

5. The semiconductor optical device according to claim 1, wherein the stress relief layer in the second section is a layer different from the uppermost layer.

6. The semiconductor optical device according to claim 1, wherein:
- the first section has a first thickness,
- the second section has a second thickness that is greater than the first thickness,
- the third section has a third thickness that is greater than the second thickness, and
- at least one of the first thickness and the second thickness is equal to or less than half of the third thickness.

7. The semiconductor optical device according to claim 1, wherein the multi-layered structure includes a barrier layer between the uppermost layer and the lowermost layer and entirely over the three or more sections, the barrier layer comprising a material configured to prevent metal diffusion.

8. The semiconductor optical device according to claim 7, wherein the barrier layer is a layer in contact with the lowermost layer.

9. The semiconductor optical device according to claim 7, wherein the multi-layered structure includes a partial barrier layer at least in the third section except for the first section, the partial barrier layer comprising a material configured to prevent metal diffusion.

10. The semiconductor optical device according to claim 9, wherein the partial barrier layer is also included in the second section.

11. The semiconductor optical device according to claim 7, wherein the material configured to prevent the metal diffusion is Pt, W, Cr, Pd, or Ta.

12. The semiconductor optical device according to claim 1, wherein the lowermost layer comprises Ti or Mo.

13. The semiconductor optical device according to claim 1, wherein a layer making up a top surface of the second section comprises Pt or Ti.

14. The semiconductor optical device according to claim 1, wherein a layer making up the first section has an end face aligned with a side of the semiconductor multilayers.

15. The semiconductor optical device according to claim 1, wherein a layer making up the first section has an end face away from a side of the semiconductor multilayers.

16. The semiconductor optical device according to claim 1, wherein the semiconductor multilayers include a mesa structure as the optical waveguide.

17. The semiconductor optical device according to claim 1, wherein the semiconductor multilayers include an active layer or an optical absorption layer that constitutes at least part of the optical waveguide.

18. The semiconductor optical device according to claim 17, wherein:
- the optical waveguide includes a non-absorbent material layer with a wider band gap than the active layer or the optical absorption layer,
- the non-absorbent material layer is adjacent to the active layer or the optical absorption layer in an optical waveguide direction, and
- the electrode has a portion, above the non-absorbent material layer, which is insulated from the semiconductor multilayers with an insulation layer.

19. The semiconductor optical device according to claim 16, wherein the electrode has the multi-terraced structure on a top of the mesa structure.

20. The semiconductor optical device according to claim 16, wherein the electrode has the multi-terraced structure on a side of the mesa structure.

* * * * *